United States Patent
Lin et al.

(10) Patent No.: US 9,645,895 B2
(45) Date of Patent: May 9, 2017

(54) DATA STORAGE DEVICE AND FLASH MEMORY CONTROL METHOD

(71) Applicant: Silicon Motion, Inc., Jhubei, Hsinchu County (TW)

(72) Inventors: Chien-Cheng Lin, Yilan (TW); Chia-Chi Liang, Taichung (TW); Chang-Chieh Huang, Zhubei (TW); Jie-Hao Lee, Kaohsiung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 232 days.

(21) Appl. No.: 14/534,569

(22) Filed: Nov. 6, 2014

(65) Prior Publication Data

US 2015/0186225 A1    Jul. 2, 2015

Related U.S. Application Data

(60) Provisional application No. 61/920,830, filed on Dec. 26, 2013.

(51) Int. Cl.
*G06F 11/14* (2006.01)
*G06F 11/10* (2006.01)
(Continued)

(52) U.S. Cl.
CPC ...... *G06F 11/1469* (2013.01); *G06F 11/1072* (2013.01); *G06F 12/0246* (2013.01);
(Continued)

(58) Field of Classification Search
CPC ............... G06F 11/1469; G06F 12/121; G06F 11/1072; G06F 12/0246; G06F 2212/1032;
(Continued)

(56) References Cited

U.S. PATENT DOCUMENTS 6,895,490 B1 * 5/2005 Moore ................. G06F 3/0607
                                                           365/230.03
6,970,890 B1    11/2005 Bruce et al.
(Continued)

FOREIGN PATENT DOCUMENTS

TW    201142589    12/2011
TW    201305817    2/2013
(Continued)

OTHER PUBLICATIONS

Non-Final Office Action mailed Apr. 18, 2016, issued in U.S. Appl. No. 14/534,488.
(Continued)

*Primary Examiner* — Rocio Del Mar Perez-Velez
(74) *Attorney, Agent, or Firm* — McClure, Qualey & Rodack, LLP (57) ABSTRACT

A data storage device with flash memory and a flash memory control method are disclosed, in which the flash memory includes multi-level cells (MLCs) and single-level cells (SLCs). A microcontroller is configured to establish a first physical-to-logical address mapping table (F2H table) in a random access memory (RAM) for a first run-time write block containing MLCs. The microcontroller is further configured to establish a second F2H table in the RAM for a second run-time write block containing SLCs. When data that was previously stored in the first run-time write block with un-uploaded mapping information in the first F2H table is updated into the second run-time write block, the microcontroller is configured to update a logical-to-physical address mapping table (H2F table) in accordance with the first F2H table. The H2F table is provided within the flash memory.

16 Claims, 7 Drawing Sheets

(51) Int. Cl.
*G06F 12/12* (2016.01)
*G06F 12/02* (2006.01)
*G11C 29/52* (2006.01)
*G11C 29/04* (2006.01)
*G06F 12/121* (2016.01)

(52) U.S. Cl.
CPC ............ *G06F 12/121* (2013.01); *G11C 29/52* (2013.01); *G06F 2212/1032* (2013.01); *G06F 2212/69* (2013.01); *G06F 2212/7201* (2013.01); *G06F 2212/7202* (2013.01); *G06F 2212/7203* (2013.01); *G06F 2212/7209* (2013.01); *G11C 2029/0411* (2013.01); *Y02B 60/1225* (2013.01)

(58) Field of Classification Search
CPC ..... G06F 2212/7202; G06F 2212/7203; G06F 2212/69; G06F 2212/7209; G06F 2212/72; G11C 29/52; G11C 2029/0411; Y02B 60/1225
See application file for complete search history.

(56) References Cited

U.S. PATENT DOCUMENTS

| | | | |
|---|---|---|---|
| 6,988,175 B2 | 1/2006 | Lasser | |
| 7,603,525 B2 | 10/2009 | Lasser | |
| 7,886,108 B2 | 2/2011 | Lee et al. | |
| 7,904,635 B2 | 3/2011 | Deng et al. | |
| 8,078,794 B2 | 12/2011 | Lee et al. | |
| 8,352,706 B2 | 1/2013 | Yano et al. | |
| 8,688,894 B2 | 4/2014 | Kuehne | |
| 9,311,006 B2 | 4/2016 | Moshayedi | |
| 9,355,028 B2 | 5/2016 | Cheng | |
| 2003/0163630 A1 | 8/2003 | Aasheim et al. | |
| 2004/0268063 A1 | 12/2004 | Lasser | |
| 2006/0282644 A1 | 12/2006 | Wong | |
| 2007/0021963 A1 | 1/2007 | Deng et al. | |
| 2008/0104309 A1* | 5/2008 | Cheon | G06F 12/0246 711/103 |
| 2008/0126680 A1 | 5/2008 | Lee et al. | |
| 2008/0215800 A1 | 9/2008 | Lee et al. | |
| 2009/0144501 A2 | 6/2009 | Yim et al. | |
| 2009/0172262 A1 | 7/2009 | Olbrich et al. | |
| 2009/0240871 A1 | 9/2009 | Yano et al. | |
| 2009/0240873 A1 | 9/2009 | Yu et al. | |
| 2009/0327589 A1 | 12/2009 | Moshayedi | |
| 2009/0327591 A1 | 12/2009 | Moshayedi | |
| 2009/0327840 A1 | 12/2009 | Moshayedi | |
| 2010/0082883 A1 | 4/2010 | Chen et al. | |
| 2010/0169551 A1* | 7/2010 | Yano | G06F 12/0246 711/103 |
| 2010/0174851 A1 | 7/2010 | Leibowitz et al. | |
| 2010/0306451 A1 | 12/2010 | Johnson | |
| 2011/0055458 A1 | 3/2011 | Kuehne | |
| 2011/0289255 A1 | 11/2011 | Wang et al. | |
| 2012/0239862 A1 | 9/2012 | Seo et al. | |
| 2012/0297121 A1 | 11/2012 | Gorobets et al. | |
| 2012/0311245 A1 | 12/2012 | Yano et al. | |
| 2013/0124782 A1* | 5/2013 | Huang | G06F 12/0246 711/103 |
| 2013/0304975 A1 | 11/2013 | Wang et al. | |
| 2013/0326120 A1 | 12/2013 | Cheng | |
| 2013/0326121 A1* | 12/2013 | Cheng | G06F 12/0246 711/103 |
| 2013/0326169 A1 | 12/2013 | Shaharabany et al. | |
| 2014/0006898 A1 | 1/2014 | Sharon et al. | |
| 2014/0101369 A1 | 4/2014 | Tomlin et al. | |
| 2014/0122776 A1 | 5/2014 | El Maghraoui et al. | |
| 2014/0136753 A1 | 5/2014 | Tomlin et al. | |
| 2015/0261444 A1 | 9/2015 | Yoshii et al. | |

FOREIGN PATENT DOCUMENTS

| | | |
|---|---|---|
| TW | 201348958 | 12/2013 |
| TW | 201348959 | 12/2013 |

OTHER PUBLICATIONS

Non-Final Office Action dated Jun. 30, 2016, issued in U.S. Appl. No. 14/534,633.
Non-Final Office Action dated Jul. 1, 2016, issued in U.S. Appl. No. 14/534,603.
Office Action dated May 26, 2016, issued in U.S. Appl. No. 14/534,686.
Office Action dated Jun. 21, 2016, issued in U.S. Appl. No. 14/534,535.

* cited by examiner

DATA STORAGE DEVICE AND FLASH MEMORY CONTROL METHOD

CROSS REFERENCE TO RELATED APPLICATIONS

This application claims the benefit of U.S. Provisional Application No. 61/920,830, filed Dec. 26, 2013, the entirety of which is incorporated by reference herein.

BACKGROUND OF THE INVENTION

Field of the Invention

The present invention relates to data storage devices with flash memory and flash memory control methods.

Description of the Related Art

Flash memory, a data storage medium, is common in today's data storage devices. For example, flash memory is typically used in memory cards, USB flash devices, solid-state drives, and so on. In another application with multi-chip package technology, a NAND flash chip and a controller chip are combined in one package as an embedded multi-media card (e.g. eMMC).

A flash memory device provides storage space which is divided into blocks, and each block includes a plurality of pages. An erase operation designed for flash memory is performed on a block-by-block basis, to release space one block at a time. For the convenient management of the flash memory, the physical-to-logical address mapping information of each block is dynamically collected in a volatile memory (e.g., an SRAM). The physical-to-logical address mapping information dynamically collected in the volatile memory has to be uploaded to the flash memory for non-volatile storage. It can be very tricky to determine when and how the mapping information uploading is performed, especially if the flash memory architecture is more complex (comprising multi-level cells and single-level cells), in which case it is more difficult to properly upload the mapping information.

BRIEF SUMMARY OF THE INVENTION

A data storage device with flash memory and a flash memory control method are disclosed, in which the flash memory includes multi-level cells and single-level cells and the physical-to-logical address mapping information for the complex flash memory architecture is properly uploaded onto the flash memory.

A data storage device in accordance with an exemplary embodiment of the disclosure comprises a flash memory and a control unit. The flash memory includes multi-level cells and single-level cells and is divided into a plurality of blocks. Each block comprises a plurality of pages. The control unit couples the flash memory to a host and comprises a microcontroller and a random access memory. The microcontroller is configured to establish a first physical-to-logical address mapping table in the random access memory for a first run-time write block between the blocks of the flash memory. The first run-time write block contains multi-level cells. The microcontroller is further configured to establish a second physical-to-logical address mapping table in the random access memory for a second run-time write block between the blocks of the flash memory. The second run-time write block contains single-level cells. When data that was previously stored in the first run-time write block with un-uploaded mapping information in the first physical-to-logical address mapping table (that has been dynamically updated in the first physical-to-logical address mapping table but has not been used in the update of the logical-to-physical address mapping table in the flash memory) is updated into the second run-time write block, the microcontroller is configured to update a logical-to-physical address mapping table in accordance with the first physical-to-logical address mapping table. The logical-to-physical address mapping table is provided within the flash memory.

After determining that the data written into to the second run-time write block was previously stored in the first run-time write block with un-uploaded mapping information in the first physical-to-logical address mapping table, and after updating the logical-to-physical address mapping table in accordance with the first physical-to-logical address mapping table, the microcontroller may continue using the first run-time write block. In some exemplary embodiments, only a spare area of the first run-time write block not including pages paired with those whose mapping information has been uploaded onto the logical-to-physical address mapping table is usable.

A flash memory control method in accordance with an exemplary embodiment of the disclosure comprises the following steps: establishing a first physical-to-logical address mapping table in a random access memory for a first run-time write block between a plurality of blocks of a flash memory, each block of the flash memory comprising a plurality of pages and the first run-time write block containing multi-level cells; establishing a second physical-to-logical address mapping table in the random access memory for a second run-time write block between the blocks of the flash memory, the second run-time write block containing single-level cells; and updating a logical-to-physical address mapping table in accordance with the first physical-to-logical address mapping table when data that was previously stored in the first run-time write block with un-uploaded mapping information in the first physical-to-logical address mapping table is updated into the second run-time write block. The logical-to-physical address mapping table is provided within the flash memory.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
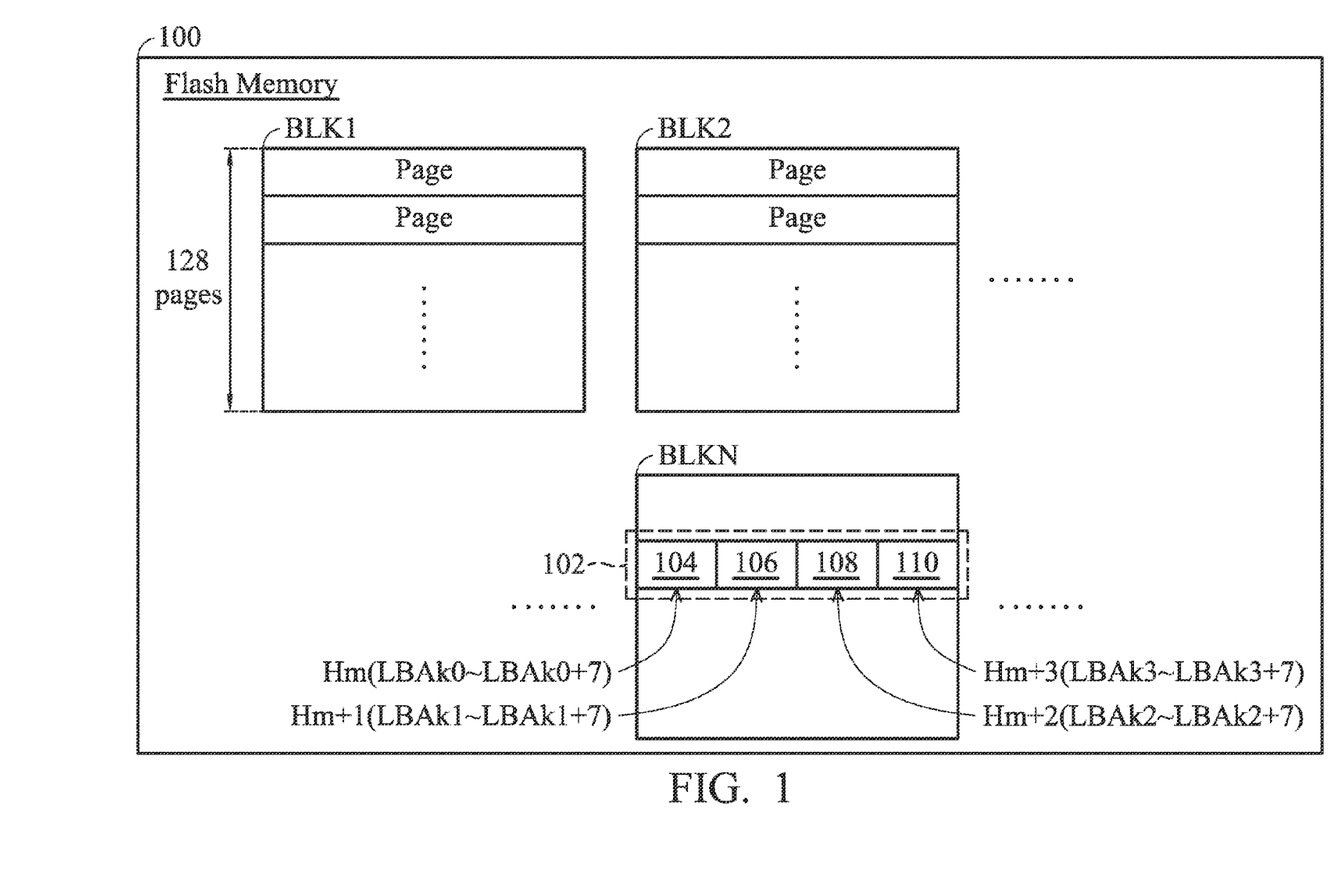
FIG. 1 depicts a storage space provided by a flash memory 100.

FIG. 1 depicts a storage space provided by a flash memory 100. The storage space provided by the flash memory 100 is divided into blocks (e.g., BLK1, BLK2 . . . BLKN . . . ). Each block includes a plurality of pages. Each page includes a plurality of sectors. For example, page 102 provided within block BLKN includes four sectors 104, 106, 108 and 110. When each sector is assigned, to store, user data of one host page (corresponding to a series of logical addresses, e.g. LBAk to LBAk+7), each physical page is assigned four host pages to store. For example, the four sectors 104, 106, 108 and 110 correspond to four host pages Hm (i.e. from LBAk0 to LBAk0+7), Hm+1 (i.e. from LBAk1 to LBAk1+7), Hm+2 (i.e. from LBAk2 to LBAk2+7) and Hm+3 (i.e. from LBAk3 to LBAk3+7), respectively. When one block contains 128 pages, there are 128×4 host pages corresponding to the 128×4 sectors of the block. For each block, the mapping information between the 128×4 sectors and the 128×4 host pages has to be recorded for storage space management. Timely updating the considerable quantity of mapping information is very tricky, especially when the flash memory 100 is in an architecture comprising multi-level cells and single-level cells.

Figure 2A:
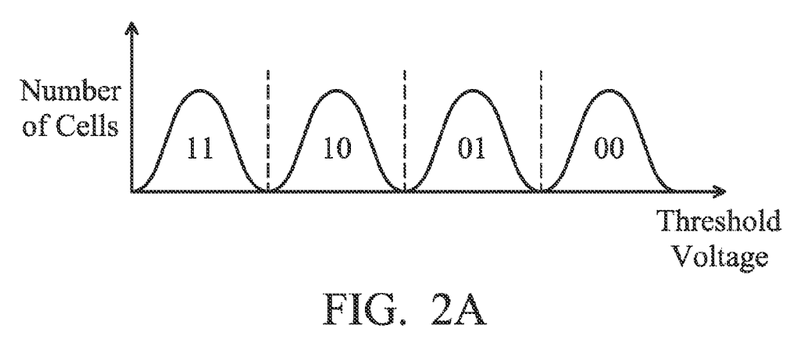
FIG. 2A illustrates the cell distribution of multi-level cells (MLCs)
Figure 2B:
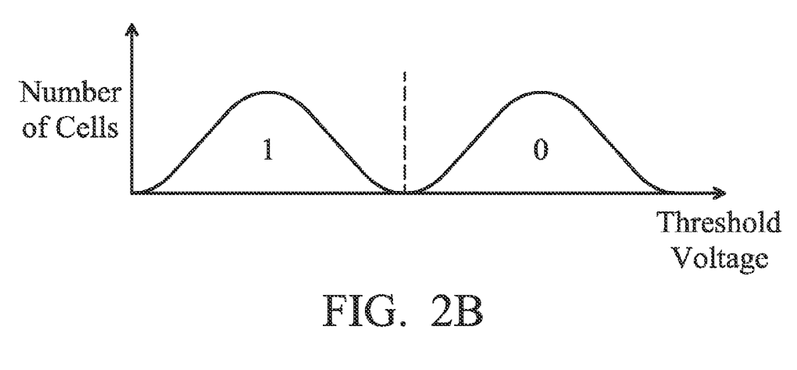
FIG. 2B illustrates the cell distribution of single level cells (SLCs)

FIG. 2A illustrates the cell distribution of multi-level cells (MLCs) and FIG. 2B illustrates the cell distribution of single level cells (SLCs). Referring to FIG. 2A, two bits are programmed per MLC, and each MLC exists in one of the four states '11', '10', '01' and '00'. Referring to FIG. 2B, one bit is programmed per SLC, and each SLC exists in one of the two states '1' and '0'. The SLCs have the advantage of faster write speeds, lower power consumption and higher cell endurance. The primary benefit of the MLCs is the higher data density. Data that was previously stored in the MLCs may be updated into the SLCs for the advantages of the SLCs.

Figure 3:
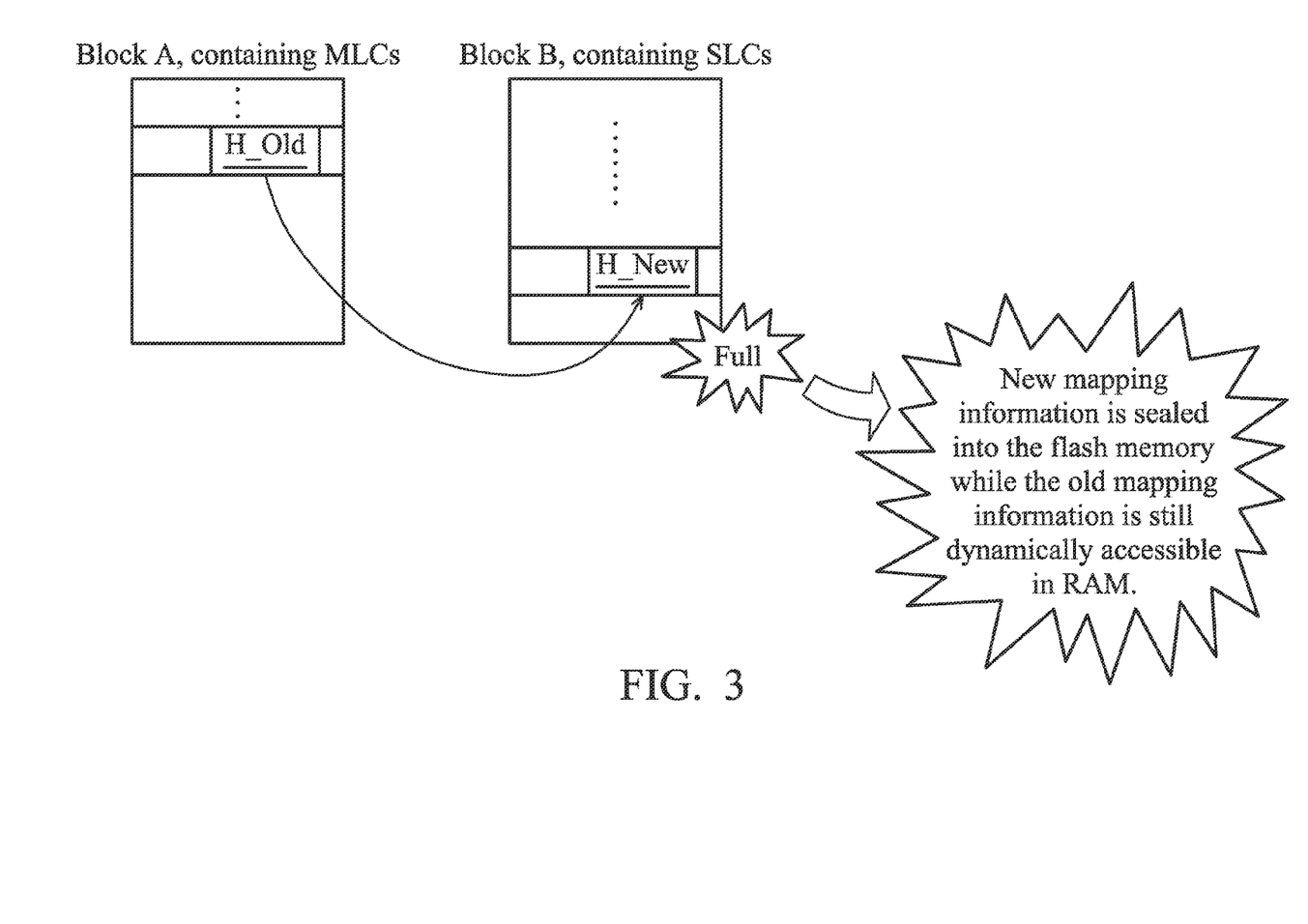
FIG. 3 shows that data previously stored in block A (containing MLCs) as H_Old is updated into block B (containing SLCs) as H_New.

FIG. 3 shows that data previously stored in block A (containing MLCs) as H_Old is updated into block B (containing SLCs) as H_New. In conventional technologies, problems may occur when block B gets full earlier than block A. When block B gets full, the new mapping information for accessing the new data H_New is erroneously sealed into the flash memory while the old mapping information corresponding to the invalid old data H_Old is still dynamically accessible in the random access memory. Even worse, when block A gets full later, the new mapping information sealed in the flash memory is overwritten by the invalid old mapping information.

Figure 4:
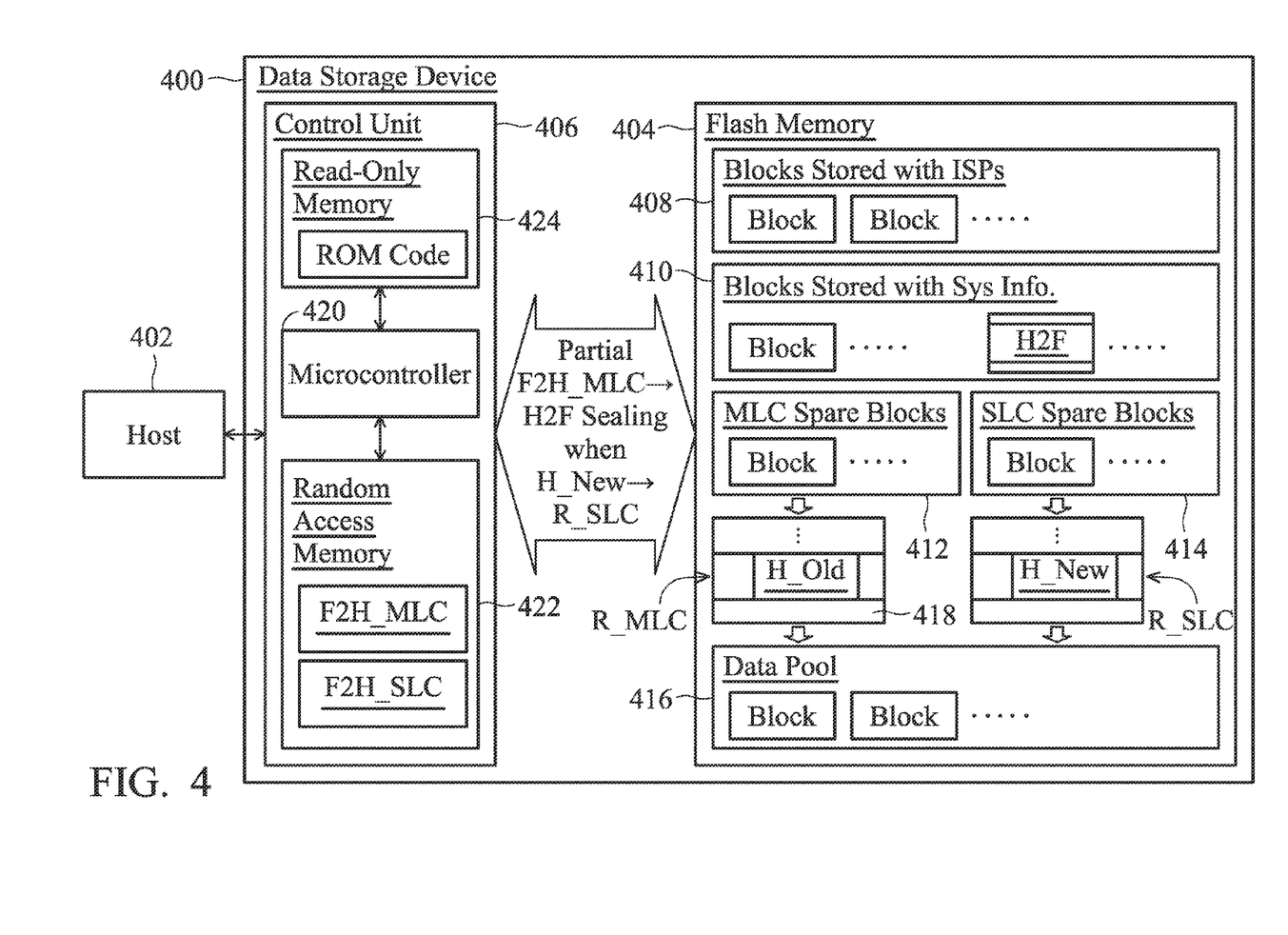
FIG. 4 is a block diagram depicting a data storage device 400 in accordance with an exemplary embodiment of the disclosure, wherein the way to establish and dynamically update the mapping information between the host 402 and the flash memory 404 is shown.

FIG. 4 is a block diagram depicting a data storage device 400 in accordance with an exemplary embodiment of the disclosure, wherein the way to establish and dynamically update the mapping information between the host 402 and the flash memory 404 is shown. The data storage device 400 includes the flash memory 404 as well as a control unit 406.

In the flash memory 404, the blocks are allocated for several purposes. Blocks 408 are stored with in-system programs (ISPs). Blocks 410 are stored with system information. Blocks 412 are spare blocks containing MLCs. Blocks 414 are spare blocks containing SLCs. Two run-time write blocks R_MLC and R_SLC are allocated from the spare blocks 412 (containing MLCs) and the spare blocks 414 (containing SLCs), respectively, for reception of write data, which will be pushed into the data pool 416 as data blocks. The flash memory 404 may further contain free blocks not shown in the figure.

The control unit 406 couples the flash memory 404 to the host 402 and comprises a microcontroller 420, a random access memory 422 and a read-only memory 424. A ROM code is stored in the read-only memory 424. The microcontroller 420 operates the flash memory 404 by executing the ROM code stored in the read-only memory 424 or/and by executing the ISPs stored in the blocks 408 of the flash memory 404. The microcontroller 420 is configured to perform the block allocation of the flash memory 404 (as shown in FIG. 4) and establish physical-to-logical address mapping tables F2H_MLC and F2H_SLC in the random access memory 422 and provide a logical-to-physical address mapping table H2F in the flash memory 404 (e.g., recorded by the system info blocks 410). The physical-to-logical address mapping table F2H_MLC is established in the random access memory 422 to dynamically record logical addresses corresponding to physical addresses of the run-time write block R_MLC. The physical-to-logical address mapping table F2H_SLC is established in the random access memory 422 to dynamically record logical addresses corresponding to physical addresses of the run-time write block R_SLC. When data that was previously stored in the run-time write block R_MLC (i.e. old data H_Old) with un-uploaded mapping information in the physical-to-logical address mapping table F2H_MLC (that has been dynamically updated in the physical-to-logical address mapping table F2H_MLC but has not been used in the update of the logical-to-physical address mapping table H2F in the flash memory 404) is updated into the run-time write block R_SLC (i.e., new data H_New), the microcontroller 420 is configured to update the logical-to-physical address mapping table H2F in accordance with the physical-to-logical address mapping table F2H_MLC. In this manner, the new mapping information contained in the physical-to-logical address mapping table F2H_SLC for accessing the new data H_New is no longer erroneously sealed into the flash memory 404 (e.g. updated into H2F) before the old mapping information contained in the physical-to-logical address F2H_MLC and corresponding to the invalid old data H_Old. This ensures that the mapping information dynamically accessible in the random access memory 422 is the newer mapping information. The physical-to-logical address mapping table F2H_MLC, therefore, may be used in updating the logical-to-physical address mapping table H2F in batches rather than being entirely uploaded onto the flash memory 404 at one time. The action to update the logical-to-physical address mapping table H2F in accordance with only part of the physical-to-logical address mapping table F2H_MLC is named "Partial F2H_MLC→H2F update (sealing)."

Figure 5:
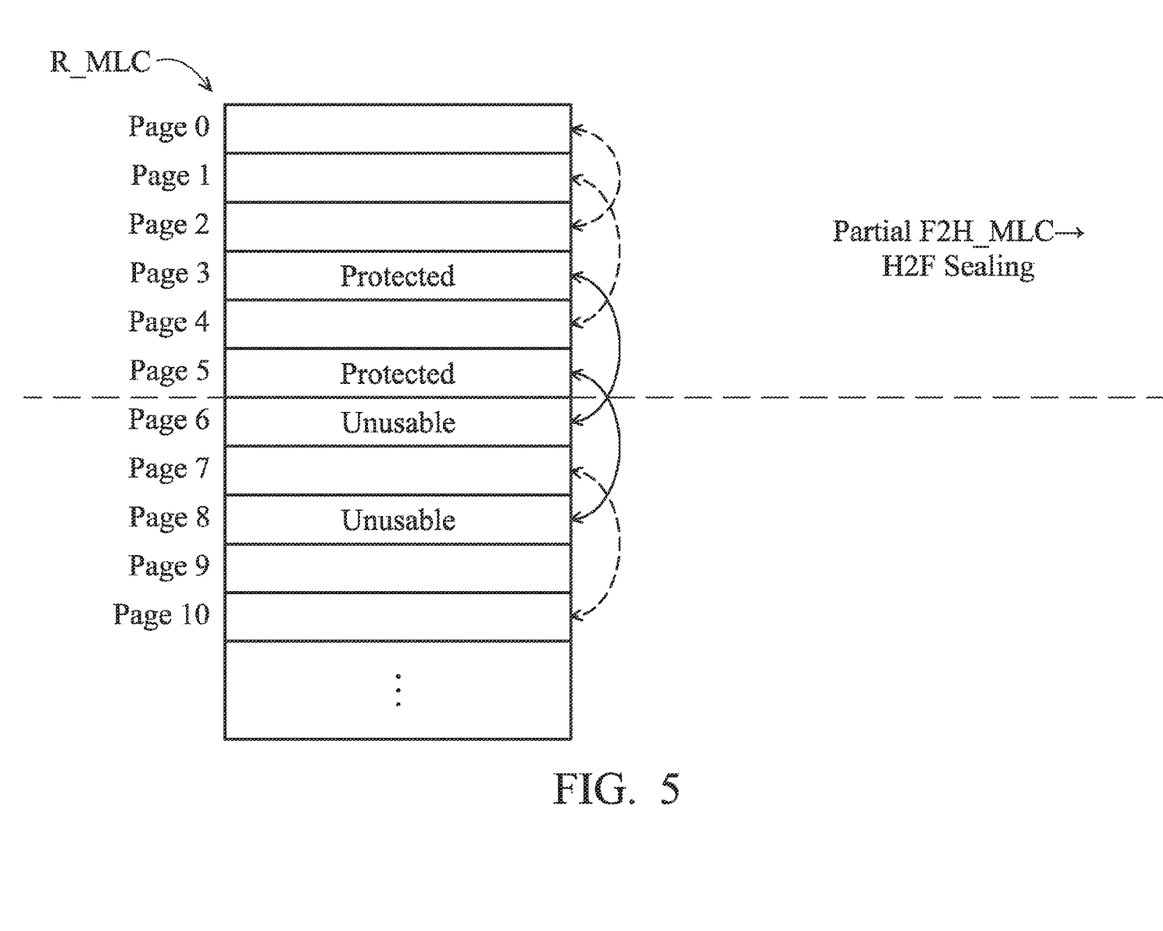
FIG. 5 shows that a partial F2H_MLC→H2F sealing has been performed for the run-time write block R_MLC, wherein the mapping information of pages 0 to 5 have been uploaded onto the logical-to-physical address mapping table H2F.

After determining that the data H_New written into to the run-time write block R_SLC was previously stored in the run-time write block R_MLC as H_Old with un-uploaded mapping information in the physical-to-logical address mapping table F2H_MLC, and after updating the logical-to-physical address mapping table H2F in accordance with the physical-to-logical address mapping table F2H_MLC, the microcontroller 420 may continue using the run-time write block R_MLC. For example, the spare pages 418 are still usable for reception of write data. When considering an unexpected power-off event, only a spare area not including pages paired with those whose mapping information has been uploaded onto the logical-to-physical address mapping table H2F is usable. FIG. 5 shows that a partial F2H_MLC→H2F sealing for the run-time write block R_MLC has been performed, wherein the mapping information of pages 0 to 5 have been uploaded onto the logical-to-physical address mapping table H2F. Each double arrow indicates one pair of pages sharing the same MLCs. After page 5, page 6 is paired with page 3 to share the same MLCs and page 8 is paired with page 5 to share the same MLCs. Page 6 and page 8 are labeled "unusable." In this manner, when an unexpected power-off event occurs after the partial F2H_MLC→H2F sealing for pages 0-5, the data contained in page 3 and page 5 are protected from damage. Because no write operations are allowed to be performed on pages 6 and 8, the data contained in page 3 (paired with page 6) and page 5 (paired with page 8) are protected from being damaged by the unexpected power-off event.

In some exemplary embodiments, the microcontroller 420 is configured to check the physical-to-logical address mapping table F2H_MLC to determine whether data H_New written into to the run-time write block R_SLC was previously stored in the run-time write block R_MLC (as H_Old) with un-uploaded mapping information in the physical-to-logical address mapping table F2H_MLC.

Figure 6:
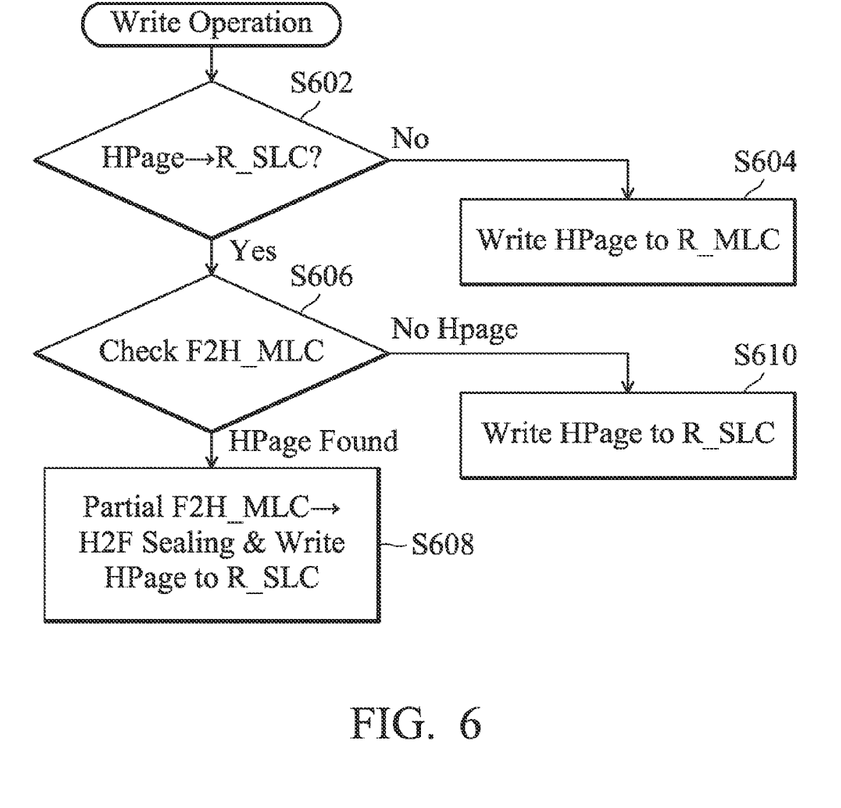
FIG. 6 is a flowchart depicting the write operation of the flash memory 404 in accordance with an exemplary embodiment of the disclosure.

FIG. 6 is a flowchart depicting the write operation of the flash memory 404 in accordance with an exemplary embodiment of the disclosure. In step S602, it is checked whether the write operation is being performed to write data (e.g., one host page HPage) into the run-time write block R_SLC. If no, step S604 is performed and data HPage is written into the run-time write block R_MLC. If yes, step S606 is performed. In step S606, the physical-to-logical address mapping table F2H_MLC is checked to determine whether data HPage written into to the run-time write block R_SLC was previously stored in the run-time write block R_MLC with un-uploaded mapping information in the physical-to-logical address mapping table F2H_MLC. When the physical-to-logical address mapping table F2H_MLC does contain the un-uploaded mapping information of the data HPage, step S608 is performed. In step S608, a partial F2H_MLC→H2F sealing is performed to update the logical-to-physical address mapping table H2F in accordance with the physical-to-logical address mapping table F2H_MLC and data HPage is written into the run-time write block R_SLC. When the physical-to-logical address mapping table F2H_MLC does not contain the un-uploaded mapping information of the data HPage, step S610 is performed and data HPage is written into the run-time write block R SLC without performing the partial F2H_MLC→H2F sealing.

Figure 7:
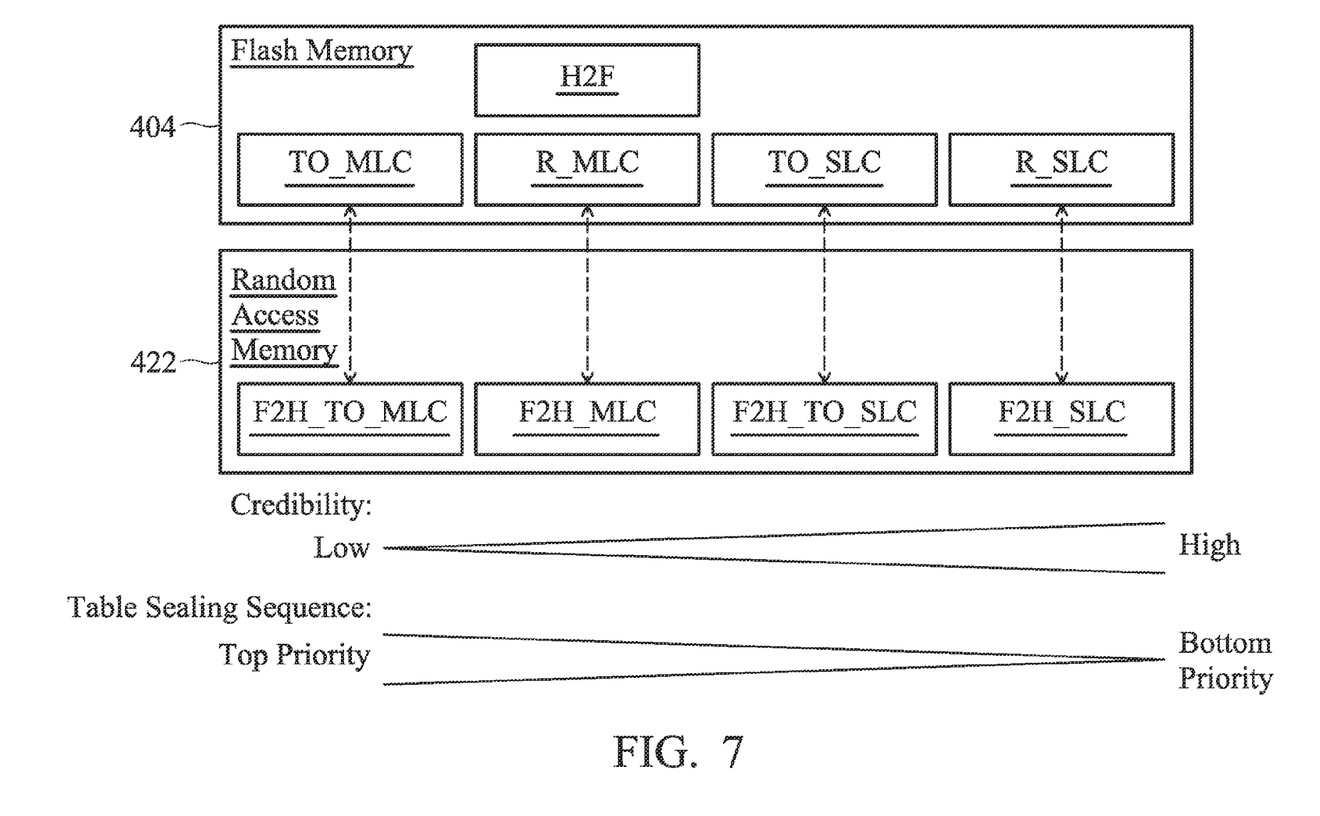
FIG. 7 illustrates that the microcontroller 420 of FIG. 4 is configured to allocate the flash memory 404 to provide the run-time write blocks R_MLC and R_SLC based on statuses of the table-outdated blocks TO_MLC and TO_SLC, respectively.

FIG. 7 illustrates that the microcontroller 420 of FIG. 4 is configured to allocate the flash memory 404 to provide the run-time write blocks R_MLC and R_SLC based on statuses of table-outdated blocks TO_MLC and TO_SLC, respectively. The table-outdated block TO_MLC contains MLCs. The table-outdated block TO_SLC contains SLCs. The mapping information of the table-outdated block TO_MLC is temporarily stored in the random access memory 422 as a physical-to-logical address mapping table F2H_TO_MLC and the mapping information of the table-outdated block TO_SLC is temporarily stored in the random access memory 422 as a physical-to-logical address mapping table F2H_TO_SLC.

In an exemplary embodiment, the microcontroller 420 is configured to allocate the flash memory 404 to provide the run-time write block R_MLC when the table-outdated block TO_MLC is full, and allocate the flash memory 404 to provide the run-time write block R_SLC when the table-outdated block TO_SLC is full. The microcontroller 420 is configured to update the logical-to-physical address mapping table H2F in accordance with the physical-to-logical address mapping table F2H_TO_MLC in intervals between write operations of the run-time write block R_MLC. The microcontroller 420 is further configured to update the logical-to-physical address mapping table H2F in accordance with the physical-to-logical address mapping table F2H_TO_SLC in intervals between write operations of the run-time write block R_SLC.

In another exemplary embodiment, the microcontroller 420 is configured to allocate the flash memory 404 to provide the run-time write block R_MLC in a power recovery process when a write operation on the table-outdated block TO_MLC was interrupted by any unexpected power-off event, and allocate the flash memory 404 to provide the run-time write block R_SLC in the power recovery process when a write operation on the table-outdated block TO_SLC was interrupted by any unexpected power-off event. The microcontroller 420 is configured to restore the physical-to-logical address mapping table F2H_TO_MLC in the power recovery process and update the logical-to-physical address mapping table H2F in accordance with the restored physical-to-logical address mapping table F2H_TO_MLC in intervals between write operations of the run-time-write block R_MLC. The microcontroller 420 is further configured to restore the physical-to-logical address mapping table F2H_TO_SLC in the power recovery process and update the logical-to-physical address mapping table H2F in accordance with the restored physical-to-logical address mapping table F2H_TO_SLC in intervals between write operations of the run-time-write block R_SLC.

Note that the credibility of the physical-to-logical address mapping tables, from high to low, is: F2H_SLC, F2H_TO_SLC, F2H_MLC and F2H_TO_MLC. Based on the aforementioned design principles, the table sealing sequence is: F2H_TO_MLC, F2H_MLC, F2H_TO_SLC and F2H_SLC, complying with the credibility rank of the four physical-to-logical address mapping tables.

Any technique using the aforementioned concept to control a flash memory is within the scope of the invention. The invention further involves flash memory control methods, which are not limited to any specific controller architecture.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A data storage device, comprising:
   a flash memory including multi-level cells and single-level cells, wherein the flash memory is divided into a plurality of blocks with each block comprising a plurality of pages; and a control unit, coupling the flash memory to a host and comprising a microcontroller and a random access memory, wherein:

the microcontroller is configured to establish a first physical-to-logical address mapping table in the random access memory for a first run-time write block between the blocks of the flash memory, and the first run-time write block contains multi-level cells;

the microcontroller is further configured to establish a second physical-to-logical address mapping table in the random access memory for a second run-time write block between the blocks of the flash memory, and the second run-time write block contains single-level cells;

in response to data that was previously stored in the first run-time write block with mapping information in the first physical-to-logical address mapping table, but not yet uploaded to the flash memory, being updated into the second run-time write block, the microcontroller is configured to update a logical-to-physical address mapping table located in the flash memory in accordance with the first physical-to-logical address mapping table.

2. The data storage device as claimed in claim 1, wherein:
the microcontroller is configured to check the first physical-to-logical address mapping table to determine whether data written into to the second run-time write block was previously stored in the first run-time write block with mapping information, not yet uploaded to the flash memory, in the first physical-to-logical address mapping table.

3. The data storage device as claimed in claim 1, wherein:
after determining that the data written into to the second run-time write block was previously stored in the first run-time write block with mapping information, not yet uploaded to the flash memory, in the first physical-to-logical address mapping table, and after updating the logical-to-physical address mapping table in accordance with the first physical-to-logical address mapping table, the microcontroller continues using the first run-time write block.

4. The data storage device as claimed in claim 1, wherein:
the microcontroller is configured to allocate the flash memory to provide the first run-time write block when a first table-outdated block between the blocks of the flash memory and containing multi-level cells and corresponding to a third physical-to-logical address mapping table is full, the third physical-to-logical address mapping table is established in the random access memory; and the microcontroller is configured to update the logical-to-physical address mapping table in accordance with the third physical-to-logical address mapping table in intervals between write operations of the first run-time write block.

5. The data storage device as claimed in claim 4, wherein:
the microcontroller is configured to allocate the flash memory to provide the second run-time write block when a second table-outdated block between the blocks of the flash memory and containing single-level cells and corresponding to a fourth physical-to-logical address mapping table is full, the fourth physical-to-logical address mapping table is established in the random access memory; and the microcontroller is configured to update the logical-to-physical address mapping table in accordance with the fourth physical-to-logical address mapping table in intervals between write operations of the second run-time write block.

6. The data storage device as claimed in claim 1, wherein:
the microcontroller is configured to allocate the flash memory to provide the first run-time write block in a power recovery process when a write operation on a first table-outdated block between the blocks of the flash memory and containing multi-level cells and corresponding to a third physical-to-logical address mapping table was interrupted by an unexpected power-off event, the third physical-to-logical address mapping table is established in the random access memory; and the microcontroller is configured to restore the third physical-to-logical address mapping table in the power recovery process and update the logical-to-physical address mapping table in accordance with the restored third physical-to-logical address mapping table in intervals between write operations of the first run-time-write block.

7. The data storage device as claimed in claim 6, wherein:
the microcontroller is configured to allocate the flash memory to provide the second run-time write block in the power recovery process when a write operation on a second table-outdated block between the blocks of the flash memory and containing single-level cells and corresponding to a fourth physical-to-logical address mapping table was interrupted by an unexpected power-off event, the fourth physical-to-logical address mapping table is established in the random access memory; and the microcontroller is configured to restore the fourth physical-to-logical address mapping table in the power recovery process and update the logical-to-physical address mapping table in accordance with the restored fourth physical-to-logical address mapping table in intervals between write operations of the second run-time-write block.

8. The data storage device as claimed in claim 3, wherein:
after determining that the data written into to the second run-time write block was previously stored in the first run-time write block with mapping information, not yet uploaded to the flash memory, in the first physical-to-logical address mapping table, and after updating the logical-to-physical address mapping table in accordance with the first physical-to-logical address mapping table, the microcontroller continues using the first run-time write block only a spare area therein which does not include pages paired with those whose mapping information has been uploaded onto the logical-to-physical address mapping table.

9. A flash memory control method, comprising:
establishing a first physical-to-logical address mapping table in a random access memory for a first run-time write block between a plurality of blocks of a flash memory, each block of the flash memory comprising a plurality of pages and the first run-time write block containing multi-level cells;

establishing a second physical-to-logical address mapping table in the random access memory for a second run-time write block between the blocks of the flash memory, the second run-time write block containing single-level cells; and updating a logical-to-physical address mapping table located in the flash memory in accordance with the first physical-to-logical address mapping table in response to data that was previously stored in the first run-time write block with mapping information not yet uploaded to the flash memory, in the first physical-to-logical address mapping table being updated into the second run-time write block.

10. The flash memory control method as claimed in claim 9, further comprising:
checking the first physical-to-logical address mapping table to determine whether data written into to the second run-time write block was previously stored in the first run-time write block with mapping information, not yet uploaded to the flash memory, in the first physical-to-logical address mapping table.

11. The flash memory control method as claimed in claim 9, further comprising:
continuing using the first run-time write block after determining that the data written into to the second run-time write block was previously stored in the first run-time write block with mapping information, not yet uploaded to the flash memory, in the first physical-to-logical address mapping table and after updating the logical-to-physical address mapping table in accordance with the first physical-to-logical address mapping table.

12. The flash memory control method as claimed in claim 9, further comprising:
allocating the flash memory to provide the first run-time write block when a first table-outdated block between the blocks of the flash memory and containing multi-level cells and corresponding to a third physical-to-logical address mapping table is full, the third physical-to-logical address mapping table is established in the random access memory; and
updating the logical-to-physical address mapping table in accordance with the third physical-to-logical address mapping table in intervals between write operations of the first run-time write block.

13. The flash memory control method as claimed in claim 12, further comprising:
allocating the flash memory to provide the second run-time write block when a second table-outdated block between the blocks of the flash memory and containing single-level cells and corresponding to a fourth physical-to-logical address mapping table is full, the fourth physical-to-logical address mapping table is established in the random access memory; and
updating the logical-to-physical address mapping table in accordance with the fourth physical-to-logical address mapping table in intervals between write operations of the second run-time write block.

14. The flash memory control method as claimed in claim 9, further comprising:
allocating the flash memory to provide the first run-time write block in a power recovery process when a write operation on a first table-outdated block between the blocks of the flash memory and containing multi-level cells and corresponding to a third physical-to-logical address mapping table was interrupted by an unexpected power-off event, the third physical-to-logical address mapping table is established in the random access memory; and
restoring the third physical-to-logical address mapping table in the power recovery process and updating the logical-to-physical address mapping table in accordance with the restored third physical-to-logical address mapping table in intervals between write operations of the first run-time-write block.

15. The flash memory control method as claimed in claim 14, further comprising:
allocating the flash memory to provide the second run-time write block in the power recovery process when a write operation on a second table-outdated block between the blocks of the flash memory and containing single-level cells and corresponding to a fourth physical-to-logical address mapping table was interrupted by an unexpected power-off event, the fourth physical-to-logical address mapping table is established in the random access memory; and
restoring the fourth physical-to-logical address mapping table in the power recovery process and updating the logical-to-physical address mapping table in accordance with the restored fourth physical-to-logical address mapping table in intervals between write operations of the second run-time-write block.

16. The flash memory control method as claimed in claim 9, further comprising:
after determining that the data written into to the second run-time write block was previously stored in the first run-time write block with mapping information, not yet uploaded to the flash memory, in the first physical-to-logical address mapping table, and after updating the logical-to-physical address mapping table in accordance with the first physical-to-logical address mapping table, continuing using the first run-time write block only a spare area therein which does not include pages paired with those whose mapping information has been uploaded onto the logical-to-physical address mapping table.

* * * * *